United States Patent
Hwang et al.

(10) Patent No.: US 11,104,108 B2
(45) Date of Patent: Aug. 31, 2021

(54) HEAT DISSIPATING COATING COMPOSITION AND HEAT DISSIPATING UNIT FORMED USING SAME

(71) Applicant: AMOGREENTECH CO., LTD., Gyeonggi-do (KR)

(72) Inventors: Seung Jae Hwang, Incheon (KR); Moon Hoe Kim, Gyeonggi-do (KR); Moon Young Hwang, Incheon (KR)

(73) Assignee: AMOGREENTECH CO., LTD., Gyeonggi-Do (KR)

( * ) Notice: Subject to any disclaimer, the term of this patent is extended or adjusted under 35 U.S.C. 154(b) by 195 days.

(21) Appl. No.: 15/564,698

(22) PCT Filed: Apr. 8, 2016

(86) PCT No.: PCT/KR2016/003745
§ 371 (c)(1),
(2) Date: Oct. 5, 2017

(87) PCT Pub. No.: WO2016/163830
PCT Pub. Date: Oct. 13, 2016

(65) Prior Publication Data
US 2018/0106562 A1 Apr. 19, 2018

(30) Foreign Application Priority Data

Apr. 8, 2015 (KR) .......... 10-2015-0049915
May 6, 2015 (KR) .......... 10-2015-0063316
Apr. 8, 2016 (KR) .......... 10-2016-0043710

(51) Int. Cl.
| C09D 163/00 | (2006.01) |
| C09D 7/40 | (2018.01) |
| C09D 7/65 | (2018.01) |
| B32B 27/20 | (2006.01) |
| C08K 3/04 | (2006.01) |

(52) U.S. Cl.
CPC .......... *B32B 27/20* (2013.01); *C08K 3/04* (2013.01); *C09D 7/67* (2018.01); *C09D 7/68* (2018.01); *Y10T 428/25* (2015.01)

(58) Field of Classification Search
None
See application file for complete search history.

(56) References Cited

U.S. PATENT DOCUMENTS

| 5,712,039 A * | 1/1998 | Marhevka .......... C09J 163/00 428/414 |
| 2008/0039555 A1* | 2/2008 | Ruyters .......... C09J 9/02 523/429 |
| 2014/0303295 A1* | 10/2014 | Kenig .......... C09K 21/02 524/114 |
| 2015/0010759 A1* | 1/2015 | Iwamura .......... C09D 201/00 428/413 |
| 2015/0299457 A1* | 10/2015 | Fu .......... C08L 63/00 428/626 |
| 2016/0009947 A1* | 1/2016 | Sugiyama .......... C08L 63/00 257/783 |

FOREIGN PATENT DOCUMENTS

| CN | 103224692 A * | 7/2013 |
| JP | 2015-007214 A | 1/2015 |
| KR | 10-2010-0079046 A | 7/2010 |
| KR | 10-2012-0076881 A | 7/2012 |
| KR | 10-2014-0043031 A | 4/2014 |
| WO | 10-2013-0008855 A | 1/2013 |

OTHER PUBLICATIONS

Li et. al., CN 103224692 A machine translation, Jul. 31, 2013 (Year: 2013).*
Momentive, EPIKURETM Epoxy Curing Agents (Year: 2012).*
International Search Authority/KR, International Search Report dated Aug. 11, 2016 in International Patent Application No. PCT/KR2016/003745 (with English translation), 4 pages.

* cited by examiner

*Primary Examiner* — Cheng Yuan Huang
(74) *Attorney, Agent, or Firm* — Masuvalley & Partners

(57) ABSTRACT

A heat dissipating coating composition is provided. A heat dissipating coating composition according to an embodiment of the present disclosure includes a coating layer forming component including a main resin. The heat dissipating coating composition also includes a carbon-based filler including 8 to 72 parts by weight with respect to 100 parts by weight of the main resin and a physical property enhancing component for improving heat dissipating and adhering properties. Accordingly, a heat dissipating coating layer having excellent heat dissipating performance can be realized by having not only good heat conductivity but also good heat radiation.

5 Claims, 3 Drawing Sheets

HEAT DISSIPATING COATING COMPOSITION AND HEAT DISSIPATING UNIT FORMED USING SAME

RELATED APPLICATIONS

This application is a U.S. National Phase application under 35 U.S.C. § 371 of International Patent Application No. PCT/KR2016/003745 filed Apr. 8, 2016, which claims priority to Korean Patent Application No. 10-2015-0049915 filed Apr. 8, 2015, Korean Patent Application No. 10-2015-0063316 filed May 6, 2015 and Korean Patent Application No. 10-2016-0043710 filed Apr. 8, 2016, which are hereby expressly incorporated by reference in their entirety for all purposes.

TECHNICAL FIELD

The present disclosure relates to a heat dissipating coating composition, more particularly, to a heat dissipating coating composition for forming a heat dissipating coating layer which exhibits excellent heat dissipating performance and simultaneously is excellent in durability of the coating layer, adhesion to the surface to be coated, and surface quality, and a heat dissipation unit coated with the same.

BACKGROUND ART

Generally, in order to prevent malfunction caused by heat generated in various parts provided in the electronic apparatus during use of the apparatus, a heat dissipating member is mounted on the heat generating component. A heat dissipating member such as a heat dissipating plate or a heat sink typically uses a metal having a high thermal conductivity so that heat in the component or the apparatus can be quickly discharged to the outside. For example, the heat sink has been generally employed as a structure in which a plurality of heat dissipating fins protruding uniformly from the front side are arranged through a method of heating and melting aluminum, copper, and alloys thereof at a high temperature, and then extrusion molding using a mold having a predetermined shape.

However, manufacturing the heat sink in which a plurality of heat dissipating fins arranged by a method of extrusion molding has problems that the manufacturing process is difficult, and the manufacturing cost is increased because a separate mold corresponding thereto must be provided in order to manufacture a heat sink having various shapes. In addition, a heat sink of metal material may have a high thermal conductivity, but there is a problem that heat dissipation efficiency is very low, which dissipates the conducted heat to the air. In order to solve this problem, attempts have been made to improve the heat dissipation by forming an oxide film on the surface of the metal heat sink by anodizing or the like, but there is a problem in that it is difficult to exhibit the desired heat dissipating performance with the resultant oxide film and the oxide film is peeled off during use so that the heat dissipating performance cannot be maintained. Furthermore, an electronic device having a heat dissipating member made of a metal material has a problem that it is difficult to reduce the weight due to the weight of the heat dissipating member and its use in mobile electronic devices is limited. When simplifying the structure of the heat dissipating member, such as reducing the number of the heat dissipating fins, and reducing the thickness of the heat dissipating member in order to solve the problems, there is a problem that it is difficult to achieve a desired level of heat dissipating performance.

Recently, in order to solve these problems, attempts have been made to improve the heat dissipating performance by forming a heat dissipating coating layer on the heat dissipating member. However, there are problems that simultaneously achieving the properties such as durability, heat dissipating performance and adhesion to the surface to be coated of the heat dissipating coating layer is difficult, the surface quality of the heat dissipating coating layer is not very good, for example, the surface of the heat dissipating coating layer is uneven or the heat dissipating filler is protruding from the surface.

It is urgently required to study a composition for forming a heat dissipating coating layer, which is capable of realizing the heat dissipating coating layer for excellent adhesion with the surface to be coated, excellent durability against external physical and chemical stimuli such as heat/moisture/organic solvent, excellent surface quality of the coating layer, and significantly improving heat dissipating performance.

DISCLOSURE OF INVENTION

Technical Problem

An object of the present disclosure is to provide a heat dissipating coating composition capable of realizing a heat dissipating coating layer that is excellent not only in thermal conductivity but also in heat dissipating property and thus exhibits excellent heat dissipating performance.

Another object of the present disclosure is to provide a heat dissipating coating composition which is excellent in adhesion to a surface to be coated and thus can significantly prevents peeling off of the heat dissipating coating layer prepared therefrom during use, and after forming a heat dissipating coating layer, can maintain the durability of the coating layer against physical and chemical stimuli such as external heat, organic solvent, moisture and impact.

Another object of the present disclosure is to provide a heat dissipation coating composition which is capable of realizing a heat dissipating coating layer having a very smooth surface and excellent smoothness and thus having excellent surface quality.

Technical Solution

In order to solve the above-mentioned problems, provided is a heat dissipating coating composition, which includes a coating layer forming component including a main resin; a carbon-based filler in an amount of 8 to 72 parts by weight based on 100 parts by weight of the main resin; and a physical property enhancing component configured to improve a heat dissipation and an adhesion.

In an exemplary embodiment of the present disclosure, the main resin may include any one or more selected from the group consisting of a glycidyl ether type epoxy resin, a glycidylamine type epoxy resin, a glycidyl ester type epoxy resin, a linear aliphatic type epoxy resin, a rubber-modified epoxy resin, and derivatives thereof. In this case, the main resin may include a glycidyl ether type epoxy resin including a bisphenol type A epoxy resin, more preferably, the bisphenol type A epoxy resin may have an epoxy equivalent of 350 to 600 g/eq.

In addition, the coating layer forming component may further include a curing agent including any one or more of an acid anhydride-based component, an amine-based component, an imidazole-based component, a polyamide-based component, and a polymercaptan-based component. When the main resin includes a bisphenol type A epoxy resin, the curing agent may include a polyamide-based component. In this case, the polyamide-based component may be a polyamide-based component having an amine value of 180 to 300 mgKOH/g.

In addition, the curing agent including the polyamide-based component may be included in an amount of 45 to 75 parts by weight based on 100 parts by weight of the bisphenol type A epoxy resin.

In addition, the carbon-based filler may include at least one of graphite and a carbon black. In addition, the carbon-based filler may be included in an amount of 17 to 42 parts by weight based on 100 parts by weight of the main resin.

In addition, the carbon-based filler may be carbon black and may have an average particle diameter of 250 nm or less, more preferably 50 to 250 nm. In addition, the carbon-based filler may have a D90 of 260 nm or less.

In addition, the physical property enhancing component may include any one or more selected from the group consisting of a 3-glycidoxypropylmethylethoxysilane, a γ-glycidoxytrimethyldimethoxysilane, a 3-glycidoxypropyltrimethoxysilane, a 3-glycidoxypropyltriethoxysilane, a 3-glycidoxypropylmethylmethoxysilane, and a 3-glycidoxypropylmethyldimethoxy silane.

In addition, the physical property enhancing component may be included in an amount of 2 to 5 parts by weight based on 100 parts by weight of the main resin.

In addition, the coating layer forming component may include a main resin including a bisphenol type A epoxy resin; and a curing agent including a polyamide-based component, and the carbon-based filler may include a carbon black.

Another aspect of the present disclosure provides a heat dissipation unit comprising a base material; and a heat dissipating coating layer formed by applying a heat dissipating coating composition to at least a portion of an outer surface of the base material and curing.

In an exemplary embodiment of the present disclosure, the heat dissipating coating layer may have a thickness of 10 to 100 μm.

In addition, the heat dissipating coating layer may include 5 to 30% by weight of a carbon-based filler based on the total weight of the heat dissipating coating layer.

In addition, the base material may be formed from one or more materials of a metal, a non-metal, and a polymer organic compound.

Advantageous Effects

According to the present disclosure, a heat dissipating coating layer having not only good heat conductivity but also good heat dissipation and thus having excellent heat dissipating performance can be realized by the heat dissipating coating composition of the present invention. In addition, the heat dissipating coating layer formed as above has very good adhesion to the surface to be coated so as to significantly prevent peeling of the heat dissipating coating layer during use, and after the heat dissipating coating layer is formed, the durability of the coating layer can be maintained despite external physical and chemical stimuli such as heat, organic solvents, moisture, and shock. Furthermore, because the surface of the formed heat dissipating coating layer is very smooth and has good evenness, the surface quality is excellent, enabling the composition to be widely used in all industries requiring heat dissipation.

BEST MODE

Figure 1:
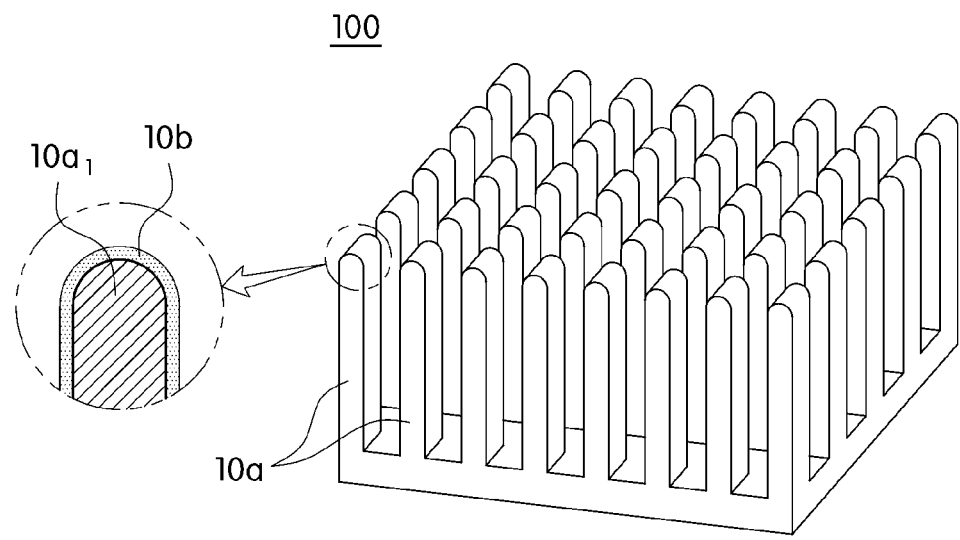
FIGS. 1 to 3 illustrate a perspective view and a partial sectional view of a heat dissipating unit according to an embodiment of the present disclosure.

Hereinafter, the present disclosure will be described in more detail.

A heat dissipating coating composition according to an embodiment of the present disclosure includes a coating layer forming component including a main resin, a carbon-based filler, and a physical property enhancing component for improving heat dissipation and adhesion, wherein the carbon-based filler is contained in an amount of 8 to 72 parts by weight based on 100 parts by weight of the main resin.

First, the coating layer forming component will be described.

The coating layer forming component may include a main resin. When the main resin is a curable resin, the coating layer forming component may further include a curing agent, and may also further include a curing promoter and a curing catalyst.

The main resin can be used without limitation as long as it is a component known in the art which is capable of forming a coating layer. However, in order to simultaneously achieve an adhesion to the base material to be coated, heat resistance not to be brittle by the heat of the heat generating substrate, and an improvement in heat dissipating performance by improving mechanical strength and compatibility with carbon-based filler, the main resin is selected at least one from the group consisting of glycidyl ether type epoxy resin, glycidylamine type epoxy resin, glycidyl ester type epoxy resin, linear aliphatic type epoxy resin, rubber-modified epoxy resin, and derivatives thereof.

In particularly, the glycidyl ether type epoxy resin may include a glycidyl ether of a phenol and a glycidyl ether of an alcohol, and the glycidyl ether of the phenol may include bisphenol-based epoxy such as bisphenol type A, bisphenol type B, bisphenol type AD, bisphenol type S, bisphenol type F, resorcinol, or the like, and phenol-based novolac such as phenol novolac epoxy, aralkyl phenol novolac, terpene phenol novolac, and cresol novolac-based epoxy resin such as o-cresol novolac epoxy, or the like, and these may be used alone or in combination of two or more thereof.

The glycidylamine type epoxy resin may include diglycidyl aniline, tetraglycidyl diaminodiphenyl methane, N,N, N',N'-tetraglycidyl-m-xylylenediamine, 1,3-bis(diglycidylaminomethyl) cyclohexane, triglycidyl-m-aminophenol and triglycidyl-p-aminophenol having a both structure of glycidyl ether and glycidylamine, or the like, and these may be used alone or in combination of two or more thereof.

The glycidyl ester type epoxy resin may include an epoxy resin by hydroxycarboxylic acid such as p-hydroxybenzoic acid or β-hydroxynaphthoic acid, polycarboxylic acid such as phthalic acid or terephthalic acid, or the like, and these may be used alone or in combination of two or more thereof.

The linear aliphatic type epoxy resin may include a glycidyl ether by 1,4-butanediol, 1,6-hexanediol, neopentyl glycol, cyclohexane dimethanol, glycerin, trimethylol ethane, trimethylol propane, pentaerythritol, dodecahydrobisphenol A, dodecahydrobisphenol F, ethylene glycol, propylene glycol, polyethylene glycol, polypropylene glycol, or the like, and these may be used alone or in combination of two or more thereof.

The rubber-modified epoxy resin is not particularly limited as long as its skeleton is an epoxy resin having rubber and/or polyether. For example, a rubber-modified epoxy resin such as an epoxy resin chemically bonded with a carboxy-modified butadiene-acrylonitrile elastomer in the molecule (CTBN-modified epoxy resin), acrylonitrile-butadiene rubber-modified epoxy resin (NBR-modified epoxy resin), urethane-modified epoxy resin, silicone-modified epoxy resin, or the like may be used and these may be used alone or in combination of two or more thereof.

However, considering that because the compatibility with the carbon-based fillers to be described later, particularly carbon black among them, is very excellent, the heat dissipating characteristics and the durability of the coating layer are improved and the surface quality of the heat dissipating coating layer is also improved, the main resin may be a glycidyl ether type epoxy resin including a bisphenol A type epoxy resin.

The bisphenol type A epoxy resin may have an epoxy equivalent of 350 to 600 g/eq. When the epoxy equivalent is less than 350 g/eq, there is a problem that the hardness of the coating layer increases and thus the coating layer can be easily broken or cracks may easily occur, and peeling of the coating layer on the curved surface may be particularly easily performed. In addition, when the epoxy equivalent is more than 600 g/eq, there is a problem that the chemical resistance, adhesion and durability may be deteriorated due to the occurrence of uncured portions.

The bisphenol type A epoxy resin may have a viscosity of 10 to 200 cps. When the viscosity of the bisphenol type A epoxy resin is less than 10 cps, there is a problem that the formation of the coating layer may be difficult and even after the formation, the adhesion with the surface to be coated may be deteriorated, when the viscosity exceeds 200 cps, it is difficult to produce a thin coating layer, the coating process may not be easy, in particular, the coating process may be more difficult in the case of spray coating. Further, there is a problem that the dispersibility of carbon black in the coating layer may be deteriorated.

In addition, the curing agent included in the coating layer forming component together with the above-described epoxy resin as the main resin may be different depending on the specific type of the epoxy resin selected, the specific kind may be a curing agent known in the art, preferably, may include any one or more of acid anhydride-based component, amine-based component, imidazole-based component, polyamide-based component, and polymercaptan-based component.

Specifically, in the case of the acid anhydride-based component, an anhydride of a compound having a plurality of carboxyl groups in one molecule is preferable. For example, the acid anhydride may include phthalic anhydride, anhydrous trimellitic acid, anhydrous pyromellitic acid, anhydrous benzophenone tetracarboxylic acid, ethylene glycol bistrimellitate, glycerol tris trimellitate, maleic anhydride, tetrahydrophthalic anhydride, methyltetrahydrophthalic anhydride, endomethyltetrahydrophthalic anhydride, methylendomethylenetetrahydrophthalic anhydride, methylbutenyltetrahydrophthalic anhydride, dodecenylsuccinic anhydride, hexahydrophthalic anhydride, methyl hexahydrophthalic anhydride, anhydrous succinic acid, methylcyclohexene dicarboxylic anhydride, chlorenedic anhydride or the like, and these may be used alone or in combination of two or more thereof.

In addition, the amine-based component may be aromatic amines, aliphatic amines, or modified products thereof. The aromatic amines, for example, may include metaphenylenediamine, diaminodiphenylmethane, diaminodiphenylsulfone, azomethylphenol, or the like, and these may be used alone or in combination of two or more thereof. In addition, the aliphatic amines, for example, may include diethylenetriamine, triethylenetetramine, or the like, and these may be used alone or in combination of two or more thereof.

In addition, the polyamides may include, for example, a polyamideamine having a plurality of amino groups in the molecule and having at least one amide group, as a reactant produced by the condensation of dimer acid and polyamine.

In addition, the imidazole-based component may include, for example, 2-methylimidazole, 2-ethyl-4-methylimidazole, 1-cyanoethyl-2-undecylimidazolium trimellitate, epoxy imidazole adduct, or the like.

In addition, the polymercaptan-based component may be, for example, those in which a mercaptan group exists at the end of the polypropylene glycol chain, or a mercaptan group exists at the end of the polyethylene glycol chain.

In addition, Instead of or in combination with the above-described curing agent, a phenol resin, an amino resin, a polysulfide resin, or the like can be included depending on the purpose.

Meanwhile, according to an embodiment of the present disclosure, when the bisphenol type A epoxy resin is contained as the main resin, the coating layer forming component may further include a polyamide-based component as a curing agent. As a result, it is very advantageous to improve the compatibility with the carbon-based filler described below, inter alia with carbon black, it is advantageous in all properties such as adhesion, durability and surface quality of the coating layer, in addition, when the adhered surface to which the heat dissipating coating composition is to be applied is curved rather than a flat plane or a step is formed, there is an advantage that cracks are generated in the heat dissipating coating layer formed on the part or being peeled off of the heat dissipating coating layer are prevented. In addition, in order to exhibit more improved physical properties, preferably, the polyamide-based component may have an amine value of 180 to 300 mgKOH/g, and more preferably, may have a viscosity of 50,000 to 70,000 cps at 40° C.

When the amine value of the polyamide-based curing agent is less than 180 mgKOH/g, the curing quality deteriorates and the surface quality, durability and adhesion may be deteriorated, and the heat dissipating performance may be deteriorated simultaneously. In addition, when the amine value exceeds 300 mgKOH/g, the curing progresses rapidly, bunching phenomenon may occur during coating. In addition, when the viscosity of the polyamide-based curing agent is less than 50,000 cps, there is a problem of flowing down after coating, when the viscosity exceeds 70,000 cps, uniform coating may not be formed when spray coating, and nozzle clogging and bunching may occur.

The coating layer-forming component may include a main resin which is a bisphenol type A epoxy resin, the polyamide curing agent may be contained in an amount of 45 to 75 parts by weight based on 100 parts by weight of the bisphenol type A epoxy resin. When the polyamide-based curing agent is contained less than 45 parts by weight, there is a problem of uncured and durability deterioration. When the polyamide-based curing agent exceeds 75 parts by weight, there may be a problem of cracking due to excessive curing.

On the other hand, the above-described coating layer forming component may include a main resin, when the main resin is a curable resin, it may further include a curing promoter in addition to the curing agent. The curing promoter serves to adjust the curing speed and the physical properties of the cured product, a known curing promoter may be selected and used according to the kind of the curing agent to be selected, and non-limiting examples of this above may include a curing promoter such as amines, imidazoles, organo phosphines, and lewis acid, or the like. As an example of the use of a curing promoter, when a polyamide-based curing agent is used, for example, a curing promoter of phenols or amines may be used in combination, and at this time, the addition amount can be appropriately changed in consideration of the equivalent amount of the epoxy resin and the like. Meanwhile, the curing catalyst may also be selected from known curing catalysts in consideration of the kind of the main resin and the kind of the curing agent, to be selected, the addition amount can be appropriately changed in consideration of the content of the main resin and the curing agent, the epoxy equivalent, the curing temperature, or the like, so that the present disclosure is not particularly limited thereto.

Next, the carbon-based filler for improving the heat dissipating performance will be described.

The carbon-based filler can be used without limitations in the case where it contains carbon in its material, and carbon-based materials known in the art can be used. In addition, the shape and size of the carbon-based filler are not limited and may be porous or non-porous in structure, and it is not particularly limited in the present disclosure because it can be selected according to the purpose.

As an example, the carbon-based filler may include at least one selected from the group consisting of carbon nanotubes such as single-walled carbon nanotube, double-walled carbon nanotube, and multi-walled carbon nanotube, graphene, graphene oxide, graphite, carbon black, and carbon-metal complex. However, the carbon-based filler may preferably contain at least one of graphite and carbon black in terms of facilitating achievement of desired physical properties such as excellent heat dissipating performance, ease of formation of a coating layer, and surface quality of a coating layer, and the carbon-based filler may more preferably be carbon black in terms of surface quality improvement of the coating layer.

The carbon black may be selected at least one kind from the kinds of known carbon black such as furnace black, lamp black, and channel black, and may be used without limitation.

However, the carbon black preferably has an average particle diameter of 250 nm or less, and more preferably 50 to 250 nm. When the average particle diameter exceeds 250 nm, the uniformity of the surface may be deteriorated, and when the average particle diameter is less than 50 nm, the product unit price may increase, and the heat dissipating performance may be deteriorated by increasing the amount of carbon black that is deposited on the surface after formation as the coating layer. Particularly, carbon black provided for surface quality may have a D90 of 260 nm or less in volume cumulative particle size distribution. When D90 exceeds 260 nm, the surface quality of the coating layer may be particularly deteriorated, for example, the surface roughness of the coating layer is increased. D90 means the particle diameter of the carbon black particles when the accumulation degree in the volume cumulative particle size distribution is 90%. Specifically, in a graph (particle size distribution based on volume) that takes the volume cumulative frequency from the side having the smallest particle diameter on the vertical axis relative to the particle diameter on horizontal axis, for the volume cumulative value (100%) of the whole particles, particle size of a particle corresponding to the cumulative value having 90% of the cumulative volume % from the smallest particle size corresponds to D90. The volume cumulative particle size distribution of the carbon black can be measured using a laser diffraction scattering particle size distribution device.

In addition, as the carbon-based filler, a carbon-based filler obtained by modifying the surface with a functional group such as a silane group, an amino group, an amine group, a hydroxyl group or a carboxyl group can be used. At this time, the functional group may be directly bonded to the surface of the carbon-based filler, or may be indirectly bonded to a carbon-based filler through a substituted or unsubstituted aliphatic hydrocarbon having 1 to 20 carbon atoms or a substituted or unsubstituted aromatic hydrocarbon having 6 to 14 carbon atoms as mediation. In addition, it may be core-shell type filler that the carbon-based material is used as a core or a shell, and the heterogeneous material constitutes the shell or the core.

The carbon-based filler is contained in an amount of 8 to 72 parts by weight based on above-described 100 parts by weight of the main resin, preferably 17 to 42 parts by weight for the purpose of further improving physical properties.

When the carbon-based filler is contained in an amount of less than 8 parts by weight based on 100 parts by weight of the main resin, there is a problem that the desired level of heat dissipating performance may not be exhibited. In addition, when the carbon-based filler is more than 72 parts by weight, the adhesion of the coating layer is weakened and peeling easily occurs, and the hardness of the coating layer becomes large, so that it can be easily broken or crushed by a physical impact. In addition, as the number of carbon-based fillers protruded on the surface of the coating layer increases, the surface roughness may increase and the surface quality of the coating layer may be deteriorated. Additionally, even when carbon-based filler is further provided, the degree of improvement in heat dissipating performance may be insignificant.

Meanwhile, preferably, the carbon-based filler is contained in an amount of less than 42 parts by weight or less. When it exceeds 42 parts by weight, in the process of applying the heat dissipating coating composition to the surface to be coated in order to realize a thin thickness coating layer, it is difficult for the composition to uniformly coat the surface to be coated when coating by some coating methods, for example, spraying, and since there is a possibility that the dispersibility of the carbon-based filler dispersed in the composition deteriorates, even though the composition is applied to the surface to be coated, the carbon-based filler may be non-uniformly dispersed and disposed, and therefore, there is a problem that it is difficult to exhibit a uniform heat dissipating performance over the entire surface of the coating layer.

Next, the physical property enhancing component included in the heat dissipating coating composition will be described.

The physical property enhancing component causes more improved heat dissipating property to be exhibited when the heat dissipating coating composition according to the present disclosure is coated on the surface to be coated, and simultaneously causes excellent adhesion to be exhibited, thereby improving durability The physical property enhancing component may be a silane-based compound, and the known silane-based compounds employed in the art can be used without limitation. However, when used together with carbon black among the carbon-based filler and the main resin of the above-described coating layer forming component, in order to exhibit a remarkable durability and heat dissipation by causing a synergistic action of desired physical properties, the silane-based compound may include any one or more selected from the group consisting of 3-glycidoxypropylmethylethoxysilane, γ-glycidoxytrimethyldimethoxysilane, 3-glycidoxypropyltrimethoxysilane, 3-glycidoxypropyltriethoxysilane, 3-glycidoxypropylmethylmethoxysilane, and 3-glycidoxypropylmethyldimethoxysilane.

In addition, the physical property enhancing component may preferably be included in an amount of 2 to 5 parts by weight based on 100 parts by weight of the main resin. When the physical property enhancing component is less than 2 parts by weight, there may be a problem that desired physical properties such as heat dissipation improvement and adhesion improvement through the physical property enhancing component cannot be achieved to the desired level. In addition, when it exceeds 5 parts by weight, there may be a problem of weakening of adhesion to the surface to be coated.

Meanwhile, the above-described heat dissipating coating composition may further include a dispersant and a solvent for improving the dispersibility of the carbon-based filler.

The dispersant may be a known component employed in the art as a dispersant for a carbon-based filler. For example, polyester-based dispersant, polyphenylene ether-based dispersant, polyolefin-based dispersant, acrylonitrile-butadiene-styrene copolymer dispersant, polyarylate-based dispersant, polyamide-based dispersant, polyamideimide-based dispersant, polyarylsulfone-based dispersant, polyether imide-based dispersant, polyether sulfone-based dispersant, polyphenylene sulfide-based dispersant, polyimide-based dispersant, polyether ketone-based dispersant, polybenzoxazole-based dispersant, polyoxadiazole-based dispersant, polybenzothiazole-based dispersant, polybenzimidazole-based dispersant, polypyridine-based dispersant, polytriazole-based dispersant, polypyrrolidine-based dispersant, polydibenzofuran-based dispersant, polysulfone-based dispersant, polyurea-based dispersant, polyurethane-based dispersant, or polyphosphazene-based dispersant, or the like can be used, and these may be used singly or in the form of a mixture or copolymer of two or more selected thereof. In addition, for example, a reaction product in which the urea component and the aldehyde component such as isobutylaldehyde are condensed can be used as a dispersant.

In addition, the solvent can be appropriately selected depending on the selected resin, curing agent and the like, the present disclosure is not particularly limited thereto, any solvent capable of allowing proper dissolution of each component can be used as the solvent, and for example, the solvent may be at least one selected from the group consisting of aqua-based solvent such as water, alcohol-based solvent, ketone-based solvent, amine-based solvent, amine-based solvent, ester-based solvent, amide-based solvent, halogenated hydrocarbon-based solvent, ether-based solvent, and furan-based solvent.

In addition, the above-described heat dissipating coating composition may contain one kind or two kinds or more of various additives such as leveling agent, pH adjusting agent, ion trapping agent, viscosity modifier, thixotropic agent, antioxidant, heat stabilizer, light stabilizer, ultraviolet absorber, coloring agent, dehydrating agent, flame retardant, antistatic agent, antifungal agent, preservative, and the like. The various additives described above can be those well known in the art and are not particularly limited in the present disclosure.

The heat dissipating coating composition according to an embodiment of the present disclosure may have a viscosity of 50 to 250 cps at 25° C. When the viscosity of the heat dissipating coating composition is less than 50 cps, the formation of a coating layer may be difficult due to flowing down of the composition, and there is a problem that the adhesion to the surface to be coated may be weakened even after the formation, and when it exceeds 250 cps, it is difficult to make a thin coating layer, the surface may not be uniform even when it is manufactured, the coating process may not be easy, and in particular, the coating process may be more difficult in the case of spray coating.

Further, there is a problem that the dispersibility of carbon black in the coating layer may be deteriorated.

Meanwhile, as illustrated in FIG. 1, the present disclosure includes a heat dissipation unit 100 including a base material 10a and a heat dissipating coating layer 10b formed by applying a heat dissipating coating composition according to the present disclosure to at least a portion of an outer surface of a base material 10a and curing it.

The base material 10a may be employed without limitation as long as it has a mechanical strength sufficient to form a coating layer after the heat dissipating coating composition according to the present disclosure is applied regardless of whether or not the base material 10a functionally has a heat dissipating characteristic. Accordingly, the base material 10a may be any one or more of a metal, a non-metal, or a polymer organic compound. The metal may be formed of any one metal selected from the group consisting of aluminum, copper, zinc, silver, gold, iron, oxides, and alloys of the metals thereof. In addition, the non-metal may be a component commonly referred to typically ceramic such as aluminum oxide. In addition, the polymer organic compound may be a polymer organic compound commonly referred to as a plastic such as polyethylene, polypropylene, polystyrene, polyvinyl chloride, acrylonitrile-butadiene-styrene resin (ABS), acrylonitrile-styrene resin (AN), methacrylic resin (PMMA), polyamide, polyacetal, polycarbonate, polyethylene terephthalate (PET), polybutylene terephthalate (PBT), fluorine resin, phenoxy resin, phenol resin (PE), urea resin (UF), melamine resin (MF), unsaturated polyester resin (UP), epoxy resin, polyurethane resin.

Figure 2:
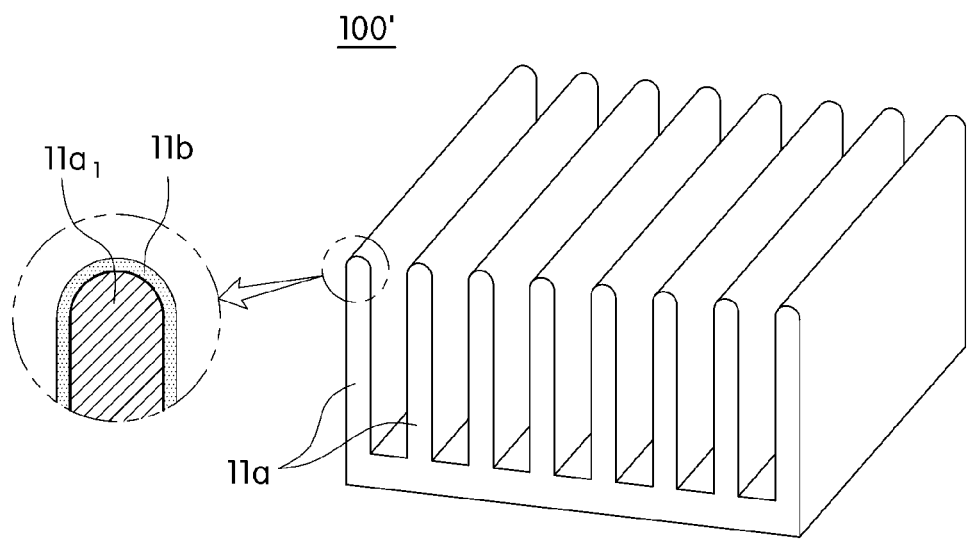
Figure 3:
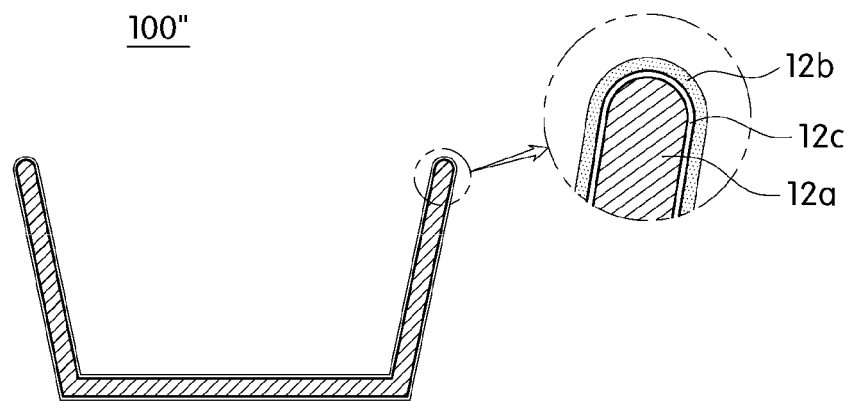

A shape of the base material 10a is not limited. When the base material 10a is a base material having heat dissipation characteristic, it may have a structure having a plurality of finned heat dissipation fins $10a_1$ as illustrated in FIG. 1 to widen the surface area for dissipating heat to the outside. Alternatively, as illustrated in FIG. 2, the base material 10a may have a structure in which a plate-shaped heat dissipation fin $11a_1$ is provided. Alternatively, as illustrated in FIG. 3, the base material 12a may be a base material 12a having a structure in which both ends of the base plate are bent upward so as to face each other to perform the function of the dissipation fin. Meanwhile, The heat dissipating coating layers 10b, 11b, and 12b formed of the heat dissipating coating composition according to an embodiment of the present disclosure exhibit improved heat dissipating performance, although the heat dissipation unit 100" as illustrated in FIG. 3 has the number of heat dissipation fins of the base material 12a being smaller than those of FIGS. 1 and 2, the heat dissipating performance can be much better than that of the heat dissipation base material having only the shape as illustrated in FIG. 1 or FIG. 2 in which the surface area is increased structurally without the heat dissipating coating layer. Accordingly, even if the base materials 10a and 11a, which are difficult to be structurally molded as illustrated in FIGS. 1 and 2 and have a structure capable of increasing the manufacturing time and the manufacturing cost are not adopted, there is an advantage that the desired level of heat dissipation performance can be achieved.

In addition, as illustrated in FIG. 1 or 2, even when the base material 10a or 11a has a complicated shape including a plurality of heat dissipation fins $10a_1$ and $11a_1$, since the adhesion of the heat dissipating coating layer is excellent, the heat dissipating coating layer may not be peeled off or cracked even on the outer surface having the bent or stepped portion.

The thickness, length, width, or the like of the base materials 10a, 11a, and 12a may be variously changed according to the size and position of the application site where the heat dissipation units 100, 100', 100" is provided, and therefore the present disclosure is not particularly limited to thereof.

Meanwhile, as illustrated in FIG. 3, the base material 12a may further include a function layer 12c between the outer surface and the heat dissipating coating layer 12b, the function layer may be a separate primer layer for improving the adhesion of the heat dissipating coating layer 12b or may be an oxide film formed by modifying the outer surface of the base material 12a such as anodizing to improve the heat dissipating performance.

The heat dissipating coating composition according to the present disclosure is coated on at least one region of the above-described base material 10a, 11a, 12a and forms a heat dissipating coating layer, and as different to FIG. 1 to FIG. 3, the heat dissipating coating layer may be formed only on a portion of the base materials 10a, 11a, 12a. Accordingly, the area covered by some coatings may be changed depending on a desired level of heat dissipating performance, and therefore the present disclosure is not particularly limited to thereof.

The heat dissipating coating layers 10b, 11b and 12b are formed by curing the heat dissipating coating composition according to the present disclosure on the outer surface of the base material. As a particular method of forming the heat dissipating coating layers 10b, 11b, and 12b, a known method of coating a heat dissipating coating composition on a base material may be selected and used, and as a non-limiting example, it can be provided by coating on various base materials by spraying, dip coating, silk screen, roll coating, deposition coating or spin coating.

When curing after the coating, the coating composition may be applied to the coating layer by treating heat and/or light according to the kind of the used main resin of the coating layer forming component and the kind of the curing agent which is provided together with the main resin in the case of curing type main resin. The temperature of the applied heat and/or the intensity of the light, the treatment time and the like may differ depending on the type of the main resin used, the kind of the curing agent, the content thereof, the thickness of the coating film, and the like. For example, when the above-described bisphenol type A epoxy resin is contained as a main resin and a polyamide curing agent is provided, it may be treated at a temperature lower than the strain point of the base material at a temperature of 60° C. to 300° C. for 10 minutes to 120 minutes. When the treatment temperature is less than 60° C., the heat dissipating coating composition is difficult to be coated on the base material, and when the treatment temperature is higher than 300° C., there is a problem that deformation of the base material and manufacturing cost are increased. In addition, when the treatment process time is less than 10 minutes, it is also difficult for the heat dissipating coating composition to be coated on the base material, and when the surface treatment process time exceeds 120 minutes, the manufacturing time of the heat dissipation device is unnecessarily increased. Accordingly, it is preferable that the surface treatment process of the heat dissipation device is performed for 10 to 120 minutes.

In addition, since the heat dissipating coating composition used in the present disclosure forms a film which rapidly cures at room temperature or at a temperature of 50° C. or lower within a few minutes without stickiness, by contacting with a solid base material, particularly a metal base material, and then exposing to air, there is little possibility of contamination by dust and the like, and final curing can also be carried out at relatively low temperatures, and thus not only the workability is excellent but also the deformation of the metal base material during curing can be prevented.

The formed heat dissipating coating layers 10b, 11b and 12b may have a thickness of 10 to 100 μm, more preferably 15 to 50 μm. When the thickness exceeds 100 μm, there may be a problem that a boiling phenomenon or the like occurs on the coating surface, and when the thickness is less than 10 μm, there may be a problem of deterioration of heat dissipation characteristics.

In addition, the heat dissipating coating layers 10b, 11b and 12b may include 5 to 30% by weight of a carbon-based filler based on the total weight of the heat dissipating coating layer. When the carbon-based filler is less than 5% by weight in the implemented heat dissipating coating layer, there is a problem that the desired level of heat dissipating performance may not be exhibited. In addition, when the carbon-based filler is more than 30% by weight, the adhesion of the coating layer is weakened and peeling easily occurs, and the hardness of the coating layer becomes large and can easily be broken or crushed by a physical impact. In addition, as the number of carbon-based fillers protruded on the surface of the coating layer increases, the surface roughness may increase and the surface quality of the coating layer may be deteriorated. Additionally, even when carbon-based filler is further provided, the degree of improvement in heat dissipating performance may be insignificant.

Meanwhile, the heat dissipating coating composition for forming the heat dissipating coating layer of the present disclosure can improve a substantial increase in the bending strength of the coating layer, an excellent adhesion between the coating layer and the base material, an improved moisture resistance and weather resistance, and a wettability of carbon-based filler, and it is possible to reduce the viscosity during compounding and increase the ductility of the surface of the base material on which the heat dissipating coating layer is formed. In addition, since the coating composition has excellent heat dissipation, exhibition excellent solvent resistance to an organic solvent, no discoloration upon curing, and ease to control heat conduction, the heat dissipation unit including the heat dissipating coating layer implemented therefrom can continuously exhibit improved physical properties. Accordingly, It can be widely applied to a heat dissipation unit or a housing in all of electric, electronic, automobile, energy, and aerospace industries, for example, an illumination device such as an LED lamp, energy charging device, heater device, display device, power device such as engine, motor and the like, energy storage device such as battery, heat transmitter, condenser, evaporator, and the like.

MODE FOR INVENTION

The present disclosure will be described in more detail by way of the following examples, the following examples do not limit the scope of the present disclosure, and it should be understood that the present disclosure is intended to assist the understanding of the present disclosure.

Example 1

The coating layer forming component was obtained by mixing 100 parts by weight of bisphenol type A epoxy resin (Kukdo CHEMICAL, YD-011) having an epoxy equivalent of 550 g/eq and, based on 100 parts by weight of bisphenol type A epoxy resin, 65 parts by weight of a polyamide-based curing agent (Kukdo Chemical, G-5022), 22 parts by weight of carbon black having an average particle diameter of 150 nm and a D90 of 190 nm, 3 parts by weight of an epoxy-based silane compound as a property enhancing component (Shanghai Tech Polymer Technology, Tech-7130), and 18 parts by weight of a dispersant (mixture of isobutylaldehyde and urea), 18 parts by weight of methyl ethyl ketone as a solvent, and 28.8 parts by weight of toluene, and 285 parts by weight of cyclohexanone as a solvent to form a mixture and stirring it. After stirring, the bubbles contained in the mixture were removed, and a final viscosity was adjusted to 100 to 130 cps based on 25° C. to provide a heat dissipating coating composition as shown in Table 1, and then stored at 5° C.

Examples 2 to 20

The heat dissipating coating composition as shown in Table 1, Table 2 or Table 3 was provided by the same manner as in Example 1, except that a kind of a carbon-based filler, an average particle diameter, a particle size distribution and a kind of a coating layer forming component as shown in Table 1, Table 2 or Table 3 are changed.

Comparative Example 1 to 4

The heat dissipating coating composition as shown in Table 4 was provided by the same manner as in Example 1, except that a content of a carbon-based filler, a type of the heat dissipation filler as shown in Table 4 are changed.

Experimental Example 1

Figure 4:
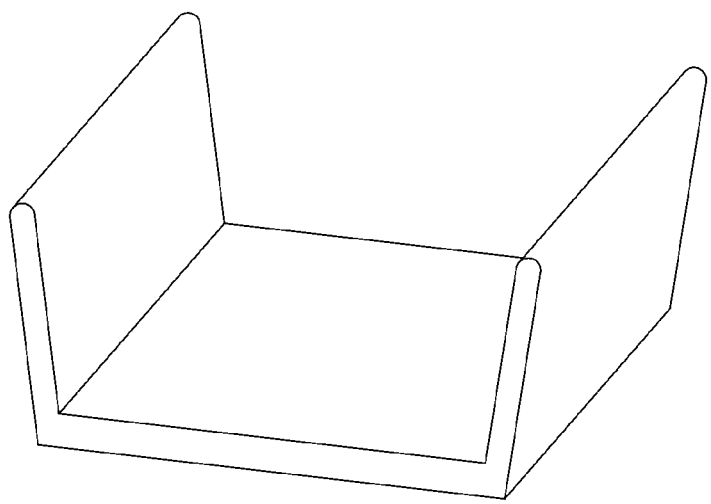
FIGS. 4 and 5 illustrate perspective views of a base material according to an embodiment of the present disclosure

The heat dissipating coating compositions prepared in Examples and Comparative Examples were applied by spray coating on the entire surface of a base material of aluminum material (Al 1050) having a shape, in which both side ends are bent upward as shown in FIG. 4, and having a thickness of 1.5 mm, a weight of 8.12 g and dimensions of 35 mm×34 mm×12 mm in width×length×height respectively, to obtain a final thickness of 25 μm, and heat treatment was performed at 150° C. for 10 minutes, and thus a heat dissipation unit was provided. The following properties of the heat dissipation unit were evaluated and are shown in Tables 1 to 4.

1. Heat Dissipation Evaluation

After placing the heat dissipation unit in the center of an acrylic chamber having the dimensions of 30 cm×30 cm×30 cm in width×length×height, the temperature inside the chamber and the temperature of the heat dissipation unit were adjusted to 25±0.2° C. Then, a heat source (a copper block with a ceramic heater) was attached to the heat dissipation unit using a thermal conductive tape (TIM): 1 W/mk to prepare test specimen. A predetermined current is applied to the heat source of the manufactured test specimen to generate heat, and after maintaining for one hour, the temperature of the heat dissipation unit was measured to evaluate the heat dissipation rate. In particularly, the heat dissipation rate was calculated according to the following Formula based on the temperature measured under the same conditions as those for the base material with no heat dissipating coating.

Heat Dissipation Rate (%)={1−(Temperature of Test Specimen (° C.)/Temperature of Uncoated Base material (° C.))}*100    Formula However, in the case of Example 13 and Comparative Example 2, durability and adhesion were evaluated as poor, and thus emissive evaluation was omitted.

2. Uniformity of Heat Dissipation Performance Evaluation

After placing the heat dissipation unit in the center of an acrylic chamber having the dimensions of 30 cm×30 cm×30 cm in width×length×height, the temperature inside the chamber and the temperature of the heat dissipation unit were adjusted to 25±0.2° C. Thereafter, a heat source having a diameter of 15 mm, a thickness of 1.5 mm and a temperature of 115° C. was directly brought into contact with the center of the lower surface of the lower plate of the heat dissipation unit, and the temperatures at four points of bending at the end of the heat-dissipation unit on the extension line of the diagonal line in the center were continuously measured. Thereafter, the time required for each of the four points to rise by 10° C. is measured in seconds, and the standard deviations for the time required at four points were calculated. It can be determined that the smaller the standard deviation is, the more uniform the heat dissipating performance, and can be interpreted that the dispersibility of the carbon-based filler in the heat dissipating coating layer is high.

3. Durability Evaluation

The surface state of the heat dissipation unit was visually evaluated after a lapse of 480 hours in a state where a heat dissipation unit was disposed in a chamber having a temperature of 60° C. and a relative humidity of 90%. As a result of evaluation, the presence or absence of cracking and peeling of the heat dissipating coating layer was confirmed, When there is no abnormality, it is indicated by o, and when abnormality occurs, it is indicated by x.

4. Adhesion Evaluation

The durability evaluated specimens were cross-cut using a knife so as to be spaced at intervals of 1 mm. a scotch tape was attached to the cut surface and pulled at an angle of 60° to confirm whether the coating layer is peeled off. Evaluation criteria were evaluated according to ISO 2409. (5B: 0%, 4B: 5% or less, 3B: 5-15%, 2B: 15-35%, 1B: 35-65%, 0B: 65% or more)

5. Surface Quality Evaluation

In order to confirm the surface quality of the heat dissipation unit, it was checked whether it was rugged or rough by touching the surface by hand. It was exhibited that when the feel was smooth, a score of 5 was given, when the area of rough feeling was less than 2% of the total area of the outer surface of the heat dissipation unit, a score of 4 was given, when the area was more than 2% but not more than 5%, a score of 3 was given, when the area was more than 5% but less than 10%, a score of 2 was given, when the area was more than 10% but less than 20%, a score of 1 was given, and when the area exceeds 20%, a score of 0 was given, respectively.

TABLE 1

|  |  | Example 1 | Example 2 | Example 3 | Example 4 | Example 5 | Example 6 | Example 7 |
|---|---|---|---|---|---|---|---|---|
| Coating layer forming component | Main resin(Type/ Epoxy equivalent (g/eq)/Content (Part by weight)) | BPA(YD-011)/550/ 100 | BPA(YD-011)/550/ 100 | BPA(YD-011)/550/ 100 | BPA(YD-011)/550/ 100 | BPA(YD-011)/550/ 100 | BPA(YD-011)/550/ 100 | BPA(YD-011)/550/ 100 |
|  | Curing agent (Type/ Amine (mgKOH/g)/ Content (Part by weight)) | PA(G-5022)/220/ 65 | PA(G-5022)/220/ 65 | PA(G-5022)/220/ 65 | PA(G-5022)/220/ 65 | PA(G-5022)/220/ 65 | PA(G-5022)/220/ 65 | PA(G-5022)/220/ 65 |
| Carbon-based filler | Type/Content (Part by weight) | Carbon black/ 22 | Carbon black/ 10 | Carbon black/ 15 | Carbon black/ 18 | Carbon black/ 40 | Carbon black/ 45 | Carbon black/ 68 |
|  | Average particle diameter (nm)/D90 (nm) | 150/192 | 150/192 | 150/192 | 150/192 | 150/192 | 150/192 | 150/192 |
| Physical property enhancing component (Part by weight) |  | 3 | 3 | 3 | 3 | 3 | 3 | 3 |
| Heat dissipation unit | Coating layer thickness (μm) | 25 | 25 | 25 | 25 | 25 | 25 | 25 |
|  | Heat dissipation (%) | 14.53 | 12.35 | 13.55 | 14.04 | 14.53 | 14.53 | 14.65 |
|  | Dissipating performance Uniformity | 0.07 | 0.07 | 0.08 | 0.08 | 0.09 | 0.16 | 0.23 |
|  | Adhesion | 5B | 5B | 5B | 5B | 5B | 4B | 4B |
|  | Durability | ○ | ○ | ○ | ○ | ○ | ○ | ○ |
|  | Surface quality | 5 | 5 | 5 | 5 | 5 | 5 | 3 |

TABLE 2

|  |  | Example 8 | Example 9 | Example 10 | Example 11 | Example 12 | Example 13 | Example 14 |
|---|---|---|---|---|---|---|---|---|
| Coating layer forming component | Main resin(Type/ Epoxy equivalent (g/eq)/Content (Part by weight)) | BPA(YD-011)/550/ 100 | BPA(YD-011)/550/ 100 | BPA(YD-011)/550/ 100 | BPA(YD-011)/550/ 100 | BPA(YD-011)/550/ 100 | BPA(YD-136)/310/ 100 | BPA(YD-012H)/650/ 100 |
|  | Curing agent (Type/ Amine (mgKOH/g)/ Content (Part by weight)) | PA(G-5022)/220/ 65 | PA(G-5022)/220/ 65 | PA(G-5022)/220/ 65 | PA(G-5022)/220/ 65 | PA(G-5022)/220/ 65 | PA(G-5022)/220/ 65 | PA(G-5022)/220/ 65 |
| Carbon-based filler | Type/Content (Part by weight) | Carbon black/ 22 | Carbon black/ 22 | Carbon black/ 22 | Carbon black/ 22 | Carbon black/ 22 | Carbon black/ 22 | Carbon black/22 |
|  | Average particle diameter (nm)/D90 (nm) | 31/64 | 58/65 | 234/253 | 261/280 | 240/272 | 150/192 | 150/192 |
| Physical property enhancing component (Part by weight) |  | 3 | 3 | 3 | 3 | 3 | 3 | 3 |
| Heat dissipation unit | Coating layer thickness (μm) | 25 | 25 | 25 | 25 | 25 | 25 | 25 |
|  | Heat dissipation (%) | 14.53 | 14.53 | 14.53 | 14.15 | 14.00 | — | 12.95 |

TABLE 2-continued

|  |  | Example 8 | Example 9 | Example 10 | Example 11 | Example 12 | Example 13 | Example 14 |
|---|---|---|---|---|---|---|---|---|
|  | Dissipating performance Uniformity | 0.06 | 0.06 | 0.08 | 0.12 | 0.08 | — | 0.22 |
|  | Adhesion | 5B | 5B | 5B | 5B | 4B | 0B | 2B |
|  | Durability | ○ | ○ | ○ | ○ | ○ | x | ○ |
|  | Surface quality | 5 | 5 | 5 | 4 | 3 |  | 5 |

TABLE 3

|  |  | Example 15 | Example 16 | Example 17 | Example 18 | Example 19 | Example 20 |
|---|---|---|---|---|---|---|---|
| Coating layer forming component | Main resin(Type/ Epoxy equivalent (g/eq)/Content (Part by weight)) | BPF(YDF-2001)/480/100 | Rubber-modified epoxy (KR-202C)/380/100 | DCPD(KDCP-150)/280/100 | BPA(YD-011)/550/100 | BPA(YD-011)/550/100 | BPA(YD-011)/550/100 |
|  | Curing agent (Type/Amine (mgKOH/g)/Content (Part by weight)) | PA(G-5022)/220/65 | PA(G-5022)/220/65 | PA(G-5022)/220/65 | Amidoamine (G-A0533)/330/65 | Alicyclic amine (KH-825)/275/65 | Phenalkamine (KMH-121X80)/200/65 |
| Carbon-based filler | Type/Content (Part by weight) | Carbon black/22 | Carbon black/22 | Carbon black/22 | Carbon black/22 | Carbon black/22 | Carbon black/22 |
|  | Average particle diameter (nm)/D90 (nm) | 150/192 | 150/192 | 150/192 | 150/192 | 150/192 | 150/192 |
| Physical property enhancing component (Part by weight) |  | 3 | 3 | 3 | 3 | 3 | 3 |
| Heat dissipation unit | Coating layer thickness (μm) | 25 | 25 | 25 | 25 | 25 | 25 |
|  | Heat dissipation (%) | — | 13.16 | 13.72 | 14.05 | 14.11 | 13.98 |
|  | Dissipating performance Uniformity | — | 0.19 | 0.18 | 0.10 | 0.11 | 0.15 |
|  | Adhesion | 0B | 1B | 1B | 2B | 0B | 0B |
|  | Durability | x | ○ | ○ | ○ | x | x |
|  | Surface quality | 5 | 5 | 5 | 5 | 5 | 4 |

TABLE 4

|  |  | Comparative Example 1 | Comparative Example 2 | Comparative Example 3 | Comparative Example 4 |
|---|---|---|---|---|---|
| Coating layer forming component | Main resin(Type/ Epoxy equivalent (g/eq)/Content(Part by weight)) | BPA(YD-011)/550/100 | BPA(YD-011)/550/100 | BPA(YD-011)/550/100 | BPA(YD-011)/550/100 |
|  | Curing agent (Type/Amine (mgKOH/g)/ Content (Part by weight)) | PA(G-5022)/220/65 | PA(G-5022)/220/65 | PA(G-5022)/220/65 | PA(G-5022)/220/65 |
| Carbon-based filler | Type/Content(Part by weight) | Carbon black/5 | Carbon black/75 | Titanium dioxide/22 | Carbon black/22 |
|  | Average particle diameter (nm)/D90(nm) | 150/192 | 150/192 | 208/255 | 150/190 |

TABLE 4-continued

|  |  | Comparative Example 1 | Comparative Example 2 | Comparative Example 3 | Comparative Example 4 |
|---|---|---|---|---|---|
| Physical property enhancing component (Part by weight) |  | 3 | 3 | 3 | Not included |
| Heat dissipation unit | Coating layer thickness (μm) | 25 | 25 | 25 | 25 |
|  | Heat dissipation (%) | 8.7 | — | 12.35 | 13.25 |
|  | Dissipating performance Uniformity | 0.07 | — | 0.13 | 0.28 |
|  | Adhesion | 5 B | 0 B | 5 B | 2 B |
|  | Durability | ○ | x | ○ | x |
|  | Surface quality | 5 | 2 | 5 | 5 |

First, as can be confirmed in Table 1,

It can be confirmed that the case of Examples 1, 4, 5 in which the content of the carbon-based filler is within the preferable range of the present disclosure achieves heat dissipation and adhesion at the same time as in Examples 2, 3, 6, 7. In particular, as can be confirmed in Examples 6 and 7, even when the content of the carbon-based filler is increased, the improvement of the heat dissipation is insignificant, and it can be confirmed that the adhesion is rather deteriorated. And, it is also confirmed that the uniformity of the dissipating performance is also deteriorated.

Next, as can be confirmed in Table 2, in the case of Examples 1 and 8 to 12 in which carbon black was provided in the same content and in the case of Example 11 in which the average particle diameter exceeds 250 nm, it is confirmed that the surface quality is deteriorated and the dissipating performance uniformity is deteriorated.

In addition, in the case of Example 12 in which the D90 of carbon black exceeded 260 nm, it was confirmed that the surface quality was remarkably deteriorated and the adhesion was also decreased, simultaneously On the other hand, in the case of Example 13 in which the epoxy equivalent of the epoxy resin as the main resin is less than the preferable range, it can be confirmed that the adhesion and durability are significantly poor. In addition, in the case of Example 14 in which the epoxy equivalent of the epoxy resin as the main resin exceeds the preferable range, it can be confirmed that the adhesion is remarkably deteriorated and the uniformity of the dissipating performance is also deteriorated.

Next, as can be confirmed in Table 3,

In the case of Examples 15 to 17 in which epoxy resins other than the bisphenol type A epoxy were used as the main resin, it can be confirmed that two or more physical properties of heat dissipation, adhesion, durability and dissipation uniformity are deteriorated, it can be determined that the above description is not suitable to achieve all the physical properties.

In addition, in the case of Examples 18 to 20 in which a different type than the polyamide type was used as the curing agent, the dissipating performance was deteriorated than in Example 1, adhesion and durability were remarkably deteriorated. In the case of Example 20, it can be confirmed that the surface characteristic s are also deteriorated.

Next, as can determined in Table 4,

In the case of Comparative Example 1 in which the content of the carbon-based filler is out of the range according to the present disclosure, it can be confirmed that the heat dissipation is not significantly better than in the examples. Also, In the case of Comparative Example 2, durability, adhesion and surface properties are very poor.

In addition, In the case of Comparative Example 3 in which the type of filler was titanium dioxide, adhesion and durability were excellent, the degree of heat dissipation was the level of Example 2, when considering that the filler content of Example 2 is less than ½ of that of Comparative Example 3, it can be expected that the carbon black is more excellent in heat dissipating performance than titanium dioxide.

In addition, In the case of comparative Example 4 which does not contain the physical property enhancing component, it can be confirmed that all of the spinnability, the uniformity of the dissipating performance, the adhesion and the durability are deteriorated.

Experimental Example 2

Figure 5:
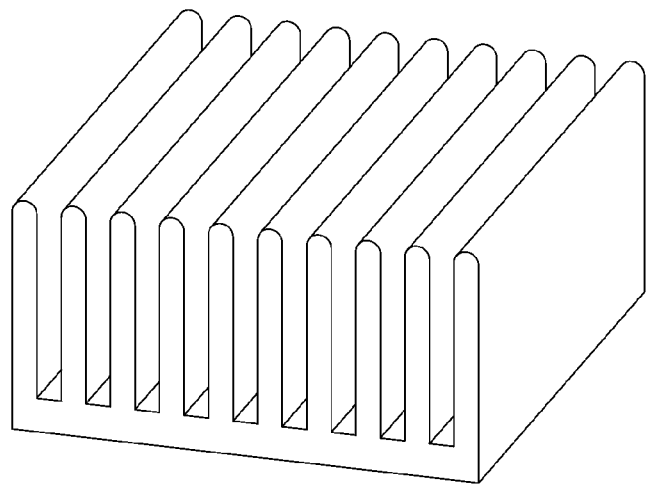

The following properties were evaluated for the heat dissipation unit (Manufacturing Example 4) produced through the composition of Example 1 among the heat dissipation units manufactured in Experimental Example 1, the heat dissipation base material (Comparative Manufacturing Example 5) related to FIG. 4 in which the heat dissipating coating layer was not treated, and the heat dissipation base material (Comparative Production Example 6) having a thickness of 2 mm and a weight of 24.33 g each of 35 mm×34 mm×12 mm in width×length×height, made by an aluminum material (Al 6063) having a structure as illustrated in FIG. 5 and were shown in Table 5 below.

1. Temperature Change of Heat Source

After placing the heat dissipation unit in the center of an acrylic chamber having the dimensions of 30 cm×30 cm×30 cm in width×length×height, the temperature inside the chamber and the temperature of the heat dissipation unit were adjusted to 25±0.2° C. Thereafter, a ceramic heater having a diameter of 15 mm, and a thickness of 1.5 mm was directly brought into contact with the center of the lower surface of the lower plate of the heat dissipation unit, a power of 620 mA and 5.2 V was applied, and the temperature of the heat source was measured after 2 hours passed.

2. Change in Chamber Internal Temperature

After placing the heat dissipation unit in the center of an acrylic chamber having the dimensions of 30 cm×30 cm×30 cm in width×length×height, the temperature inside the chamber and the temperature of the heat dissipation unit were adjusted to 25±0.2° C. Thereafter, a ceramic heater having a diameter of 15 mm, and a thickness of 1.5 mm was directly brought into contact with the center of the lower surface of the lower plate of the heat dissipation unit, a power of 620 mA and 5.2 V was applied, and the temperature inside the chamber was measured after 2 hours passed.

TABLE 5

|  |  | Manufacturing example 4 | Comparative Manufacturing Example 5 | Comparative Manufacturing Example 6 |
|---|---|---|---|---|
| Heat dissipation unit | existence and nonexistence of coating layer | o(Example 4) | x | x |
|  | Heat source temperature (° C.) | 70.6 | 82.6 | 79.0 |
|  | Chamber internal temperature (° C.) | 26.5 | 26.2 | 26.2 |

As can determined in Table 5,

It can be confirmed that the heat dissipation base material of Comparative Manufacturing Example 6 having a large surface area has a somewhat higher heat dissipating performance than the heat dissipation base material of Comparative Manufacturing Example 5.

Meanwhile, in the case of Manufacturing Example 4 having a heat dissipating coating layer implemented with the coating composition according to one embodiment of the present disclosure in the heat dissipation base material of Comparative Manufacturing Example 5 having a small surface area, it can be confirmed that the heat dissipating performance is improved by about 10% compared with Comparative Manufacturing Example 6 despite the low surface area of the heat dissipation base material itself.

Although the foregoing embodiments of the present disclosure have been described above, the spirit of the present disclosure is not limited to the embodiments set forth herein. A person skilled in the art who understands the spirit of the present disclosure may readily suggest other embodiments by adding, changing, deleting, or the like to components within the scope of the same concept, and all such changes are included within the spirit of the present disclosure.

The invention claimed is:

1. A heat dissipating coating composition, comprising:
a coating layer forming component comprises a main resin consisting of a bisphenol A epoxy resin having an epoxy equivalent of 550 g/eq and a curing agent including
a polyamide-based component having an amine value of 220 mgKOH/g, wherein the polyamide-based component is included in an amount of 65 parts by weight based on 100 parts by weight of the bisphenol type A epoxy resin;
a carbon-based filler including a carbon black in an amount of 22 parts by weight based on 100 parts by weight of the main resin, wherein the carbon-based filler has an average particle size of 150 nm and a D90 of 192; and
a physical property enhancing component which is an epoxy-based silane compound in an amount of 3 parts by weight to improve a heat dissipation and an adhesion.

2. The heat dissipating coating composition of claim 1, wherein the carbon-based filler further includes a graphite.

3. The heat dissipating coating composition of claim 1, wherein the epoxy-based silane compound includes any one or more selected from the group consisting of a 3-glycidoxypropylmethylethoxysilane, a γ-glycidoxy trimethyldimethoxysilane, a 3-glycidoxypropyltrimethoxysilane, a 3-glycidoxypropyltriethoxysilane, a 3-glycidoxypropylmethylmethoxysilane, and a 3-glycidoxypropylmethyldimethoxysilane.

4. The heat dissipating coating composition of claim 1, wherein the epoxy-based silane compound is included in an amount of 2 to 5 parts by weight based on 100 parts by weight of the main resin.

5. The heat dissipating coating composition of claim 1, wherein the heat dissipating coating composition has a viscosity of 50 to 250 cps.

* * * * *